US007477518B2

(12) United States Patent
Stolze et al.

(10) Patent No.: US 7,477,518 B2
(45) Date of Patent: Jan. 13, 2009

(54) SUB-ASSEMBLY

(75) Inventors: Thilo Stolze, Arnsberg (DE); Richard Boettcher, Warstein (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 12/033,327

(22) Filed: Feb. 19, 2008

(65) Prior Publication Data
US 2008/0158822 A1    Jul. 3, 2008

Related U.S. Application Data

(63) Continuation-in-part of application No. 11/682,483, filed on Mar. 6, 2007, which is a continuation of application No. PCT/EP2005/007514, filed on Jul. 12, 2005.

(30) Foreign Application Priority Data
Sep. 6, 2004    (DE)    ........................ 10 2004 043 019

(51) Int. Cl.
*H05K 7/20* (2006.01)
*H01L 23/24* (2006.01)

(52) U.S. Cl. ........................ 361/715; 361/704; 361/717; 165/185; 257/712; 257/719

(58) Field of Classification Search ................ 361/704, 361/707, 709–710, 714–715, 717–719, 760, 361/772–773, 776; 165/104.33, 185; 257/688, 257/696, 706–707, 712–713, 718–719; 174/16.3
See application file for complete search history.

(56) References Cited

U.S. PATENT DOCUMENTS

| 6,160,710 | A  | * | 12/2000 | Ahl et al. ..................... 361/707 |
| 6,245,186 | B1 | * | 6/2001  | Alcoe et al. .................. 156/300 |
| 7,106,592 | B2 | * | 9/2006  | Inoue et al. .................. 361/704 |
| 7,161,087 | B2 | * | 1/2007  | Hunkeler et al. ........ 174/153 G |
| 7,417,198 | B2 | * | 8/2008  | Betz et al. .................... 174/536 |

OTHER PUBLICATIONS

FS50R06W1W3 Datasheet, Daniel Kreuzer, May 11, 2007, Revision 2.0.
FS30R06W1E3 Datasheet, Daniel Kreuzer, Jun. 29, 2007, Revision 2.0.
FS20R06W1E3 Datasheet, Daniel Kreuzer, Jun. 29, 2007, Revision 2.0.

* cited by examiner

*Primary Examiner*—Jayprakash N Gandhi
*Assistant Examiner*—Robert J Hoffberg
(74) *Attorney, Agent, or Firm*—Coats & Bennett, P.L.L.C.

(57) ABSTRACT

According to an embodiment, a power semiconductor module comprises a heat-dissipation contact area configured to thermally connect the power semiconductor module to a cooling element. The power semiconductor module also comprises a housing and a press-on element. The press-on element comprises an anchoring region and is captively anchored in the housing. A fixing eye is resiliently coupled with the anchoring region.

16 Claims, 3 Drawing Sheets

SUB-ASSEMBLY

CROSS-REFERENCE TO RELATED APPLICATION

This application is a continuation-in-part of co-pending U.S. patent application Ser. No. 11/682,483 filed Mar. 6, 2007, which is a continuation of International Application No. PCT/EP2005/007514 filed Jul. 12, 2005 designating the United States, which claims priority to German application number DE 10 2004 043 019.5 filed Sep. 6, 2004.

BACKGROUND OF THE INVENTION

The invention relates to a power semiconductor module comprising a heat-dissipation contact area for thermally conductive connection to a cooling element.

A module construction of this type is customary and known e.g. from DE 199 42 915 A1. Said known module comprises an insulating and thermally conductive carrier (substrate) composed e.g. of a ceramic material coated e.g. with copper (DCB) on both sides. Conductor track structures are formed in the top side coating, a plurality of power semiconductors being electrically connected to the structures. The substrate underside functions as a heat-dissipation contact area in order to be able to dissipate power losses occurring in the form of heat during operation to a heat sink. For this purpose, a press-on device engaging over a plurality of substrates is provided, having pressure pieces which both serve for electrical contact-connection and press the substrates onto the heat sink.

DE 297 20 480 U1 and DE 200 14 739 U1 show press-on elements in the form of a clip which is connected by at least one fixing region to the cooling element in a positively locking manner (DE 297 20 480 U1) or by screw connection (DE 200 14 739 U1). A press-on region of the clip presses the component to be cooled onto the cooling element by its heat-dissipation contact area.

The mounting of the known power semiconductor module on the cooling element is complicated and cost-intensive because the press-on element/elements has/have to be handled, supplied and mounted separately in the mounting process. Depending on the configuration of the power semiconductor module and the press-on element, mounting errors may occur in this case—e.g. as a result of defective positioning or orientation—and said mounting errors influence the cooling effect and hence the operational reliability. Moreover, the connection between power semiconductor module and press-on element involves dimensional tolerances which have an unforeseeable effect on the magnitude of the press-on forces exerted.

SUMMARY OF THE INVENTION

According to an embodiment, a power semiconductor module comprises a heat-dissipation contact area configured to thermally connect the power semiconductor module to a cooling element. The power semiconductor module also comprises a housing and a press-on element. The press-on element comprises an anchoring region and is captively anchored in the housing. A fixing eye is resiliently coupled with the anchoring region.

Of course, the present invention is not limited to the above features and advantages. Those skilled in the art will recognize additional features and advantages upon reading the following detailed description, and upon viewing the accompanying drawings.

DETAILED DESCRIPTION OF THE INVENTION

A power semiconductor module is thermally connected to a cooling element in a simple, cost-effective and reliable manner. According to an embodiment, the power semiconductor module comprises at least one press-on element which is captively connected to the power semiconductor module. The press-on element presses a heat-dissipation contact area of the module onto the cooling element in the mounted state, thereby ensuring a desired reliable thermally conductive contact between the power semiconductor module and cooling element.

In an embodiment, the press-on element, upon connection of a module to a cooling element, does not have to be separately delivered, stored, handled, supplied and finally mounted at the power semiconductor module. Since the press-on element is configured as an integral element that is captively connected to the power semiconductor module, it advantageously forms an (in this respect prefabricated) sub-assembly for simple and cost-effective mounting on and connection to the cooling element. Since the connection between the power semiconductor module and the press-on element is prefabricated (in an automated manner), significantly smaller tolerances can also be complied with, thereby reducing the power semiconductor module/press-on element/cooling element tolerance chain that determines the press-on forces.

A further advantage, according to an embodiment, consists in the fact that suitably dimensioned press-on elements can be fixedly assigned and predetermined by the manufacturer. During mounting, therefore, the user is not faced with the task of having to dimension or assign suitable press-on elements. Various power semiconductor modules (e.g. with different powers) can thus be provided with uniform press-on elements, which further simplifies stock keeping and logistics.

According to one embodiment, the power semiconductor module comprises a press-on element having an anchoring region and a fixing eye. The anchoring region is captively anchored in a housing of the module. The fixing eye is resiliently coupled with the anchoring region.

In another embodiment, the power semiconductor module comprises a housing which is formed from a mold compound, and a press-on element. The press-on element comprises an anchoring region with at least one opening, which is embedded in the mould compound. Such configuration can be achieved by injection-molding the anchoring region with its at least one opening into the material of an injection-molding housing of the power semiconductor module.

Figure 1:
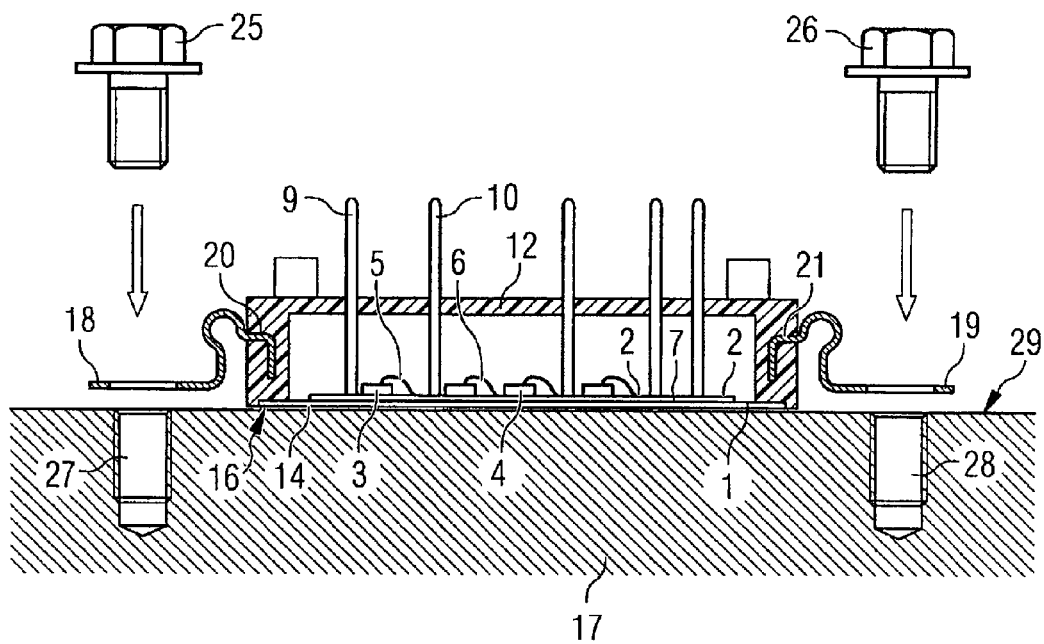
FIG. 1 is a diagram of an embodiment of a power semiconductor module in longitudinal section.

FIG. 1 shows a power semiconductor module comprising a substrate 1, which is embodied as a ceramic lamina coated with copper (DCB) on both sides. On the top side 2, in a manner known per se, a plurality of power semiconductors 3, 4 are arranged and connected by base-side soldering and/or bonding wires 5, 6 to conductor tracks 7 formed on the top side. In addition, electrical connection contacts, e.g. 9, 10, extend upward. The substrate 1 and the power semiconductor arrangement are covered by a plastic housing 12 produced by injection molding. The underside 14 of the substrate simultaneously forms the lower outer area and serves by virtue of its copper coating—formed over the whole area—as heat-dissipation contact area 16 for thermally conductive connection to a cooling element 17.

Press-on elements 18, 19 shaped in clamp-type fashion with a respective anchoring region 20, 21 are in each case injection-molded into the housing 12 on both sides. The housing material (plastic) thus surrounds the anchoring regions and provides for a fixed, captive seating of the press-on elements. The press-on elements thus already become integral constituent parts of the power semiconductor module in a very early manufacturing stage—preferably during the production of the housing 12. For this purpose, the press-on elements can be inserted as insert parts into the plastic injection-molding mold for the housing and be integrated in a single injection-molding operation—which is required anyway for producing the housing 12.

Figure 2:
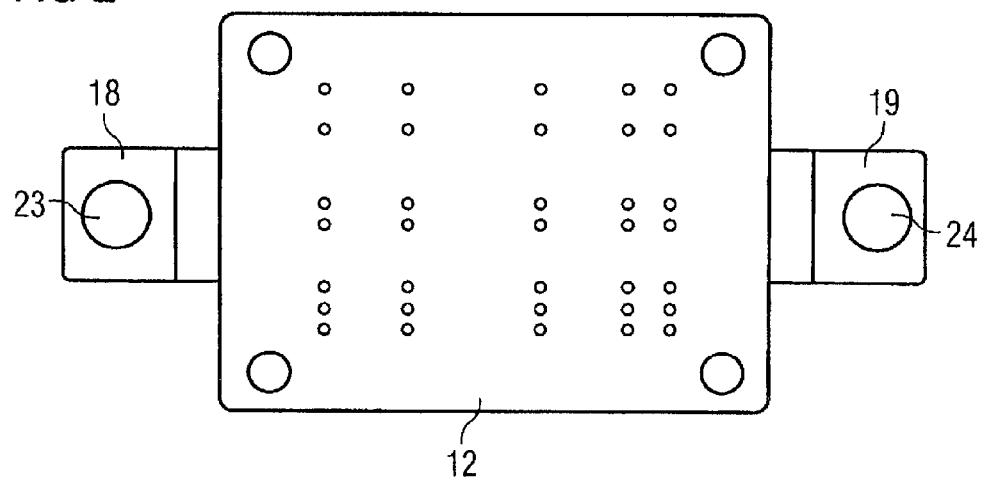
FIG. 2 is a diagram of the power semiconductor module of FIG. 1 in plan view.

FIG. 2 shows the arrangement and configuration of the press-on elements 18, 19 in plan view for illustration. A symmetrical arrangement of the press-on elements 18, 19 is chosen here; this is not mandatory, however. Asymmetrical configurations or else—depending on the press-on force desired—only one press-on element or more than two press-on elements are likewise conceivable. The press-on elements 18, 19 have holes 23, 24 through which fixing screws 25, 26 (FIG. 1) can reach for the releasable mounting of the module on the cooling element 17.

As indicated by arrows (FIG. 1), the press-on elements 18, 19 are pressed onto the top side 29 of the cooling element 17 by the screws 25, 26 reaching into threaded holes 27, 28, respectively. In this case, the press-on elements 18, 19 generate the desired homogeneous press-on forces on account of their spring-elastic properties. The power semiconductor module therefore combines the advantages of the press-on properties that can be generated by press-on elements or resilient clamps with a simple and cost-effective realization of the connection to the cooling element 17.

Figure 3:
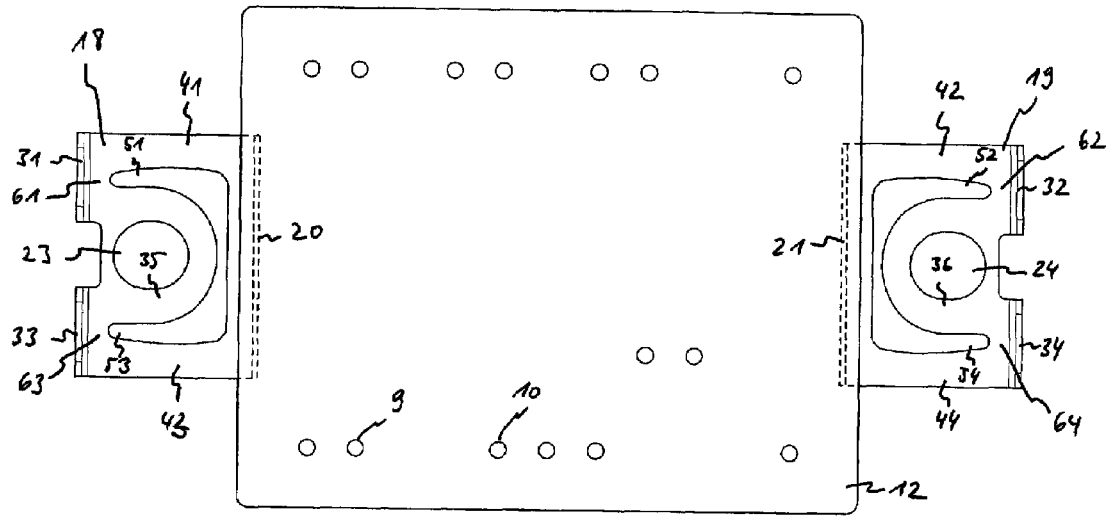
FIG. 3 is a diagram of another embodiment of a power semiconductor module in plan view.

FIG. 3 shows a plan view of another embodiment of a power semiconductor module. This module may have the same interior configuration as the module described in FIG. 1. The module of FIG. 3 also comprises a plastic housing 12 produced by injection molding, connection contacts 9, 10 for electrically connecting the module, and press-on elements 18, 19 shaped in clamp-type fashion. Each of the press-on elements 18, 19 comprises a respective anchoring region 20, 21 (plotted in dashed lines) which is injection-molded into the housing 12.

Further, the press-on elements 18, 19 comprise fixing eyes 35, 36, spring arms 41, 42, 43, 44, and bent over ends 31, 32, 33, 34, respectively. In each of the fixing eyes 35, 36, a hole 23 and 24, respectively, is formed through which fixing screws (not shown) can reach for the releasable mounting of the module on a cooling element 17. The press-on elements 18, 19 comprise spring arms 42, 43 and 41, 44, respectively, joining the anchoring regions 20, 21 with the respective fixing eye 35 and 36, and with the respective bent over ends 31, 33 and 32, 34 so as to resiliently couple the fixing eyes 35, 36 with the respective anchoring region 20, 21, i.e. with the plastic housing 12.

The spring arms 41, 42, 43, 44 are partly separated from the respective fixing eyes 35, 36 by cuts 51, 52, 53, 54 which are formed in the press-on elements 18, 19 such that between each of the spring arms 41, 42, 43, 44 and the respective fixing eye 35, 36 a connection web 61, 62, 63 and 64, respectively, remains. To protect these webs 61, 62, 63, 64 from kinking when mounting the module on the cooling element 17, the press-on elements 18, 19 comprise bent over ends 31, 32, 33, 34 which are arranged adjacent to the respective webs 61, 62, 63, 64 opposite the respective cut 51, 52, 53, 54.

Figure 4:
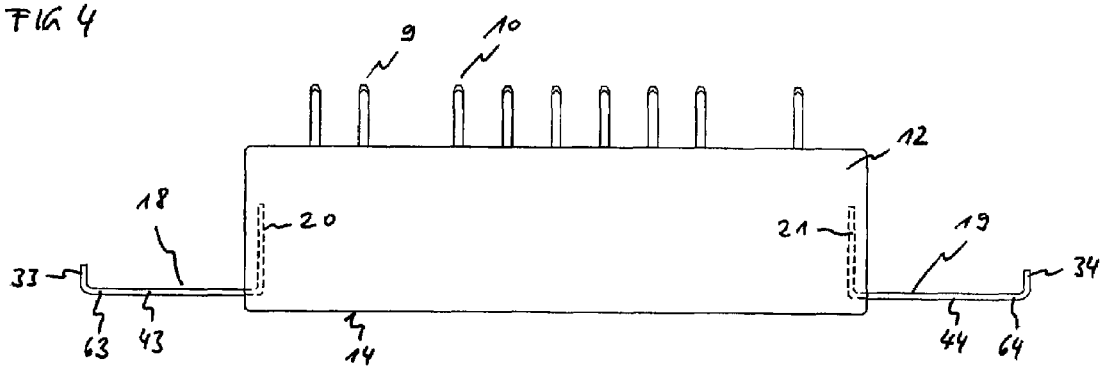
FIG. 4 is a diagram of the power semiconductor module of FIG. 3 in side view.

FIG. 4 shows the un-mounted module of FIG. 3 in side view. In the un-mounted state, the spring arms 41, 42, 43, 44 are relaxed and the press-on elements 18, 19 are spaced distant from the plane of the underside 14. As can be seen from FIG. 4, the ends 31, 32, 33, 34 of the press-on elements 18, 19 are bent upwardly.

Figure 5:
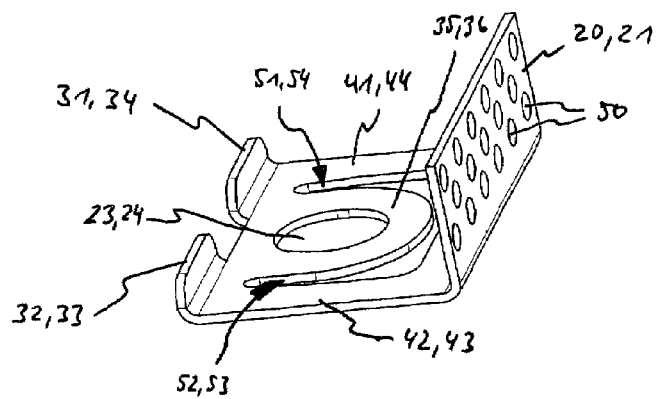
FIG. 5 is a diagram of an embodiment of the press-on elements of the module of FIGS. 3 and 4 in perspective view.

As already described above, the anchoring regions 20, 21 of the press-on elements 18, 19 are injection-molded into the housing 12 such that the anchoring regions 20, 21 are surrounded by the plastic material of the housing 12. To facilitate unhinging of the housing 12 from the mold after the injection-molding process, the molding compound may comprise a mold release agent. However, such mold release agent also affects the fixing of the anchoring regions 20, 21 in the housing 12. In order to improve this fixing, the anchoring regions 20, 21 may comprise at least one, or as shown in the press-on element 18, 19 in FIG. 5, a number of openings 50 through which the mold compound can penetrate during the injection-molding process, which results in an improved fixing.

Figure 6:
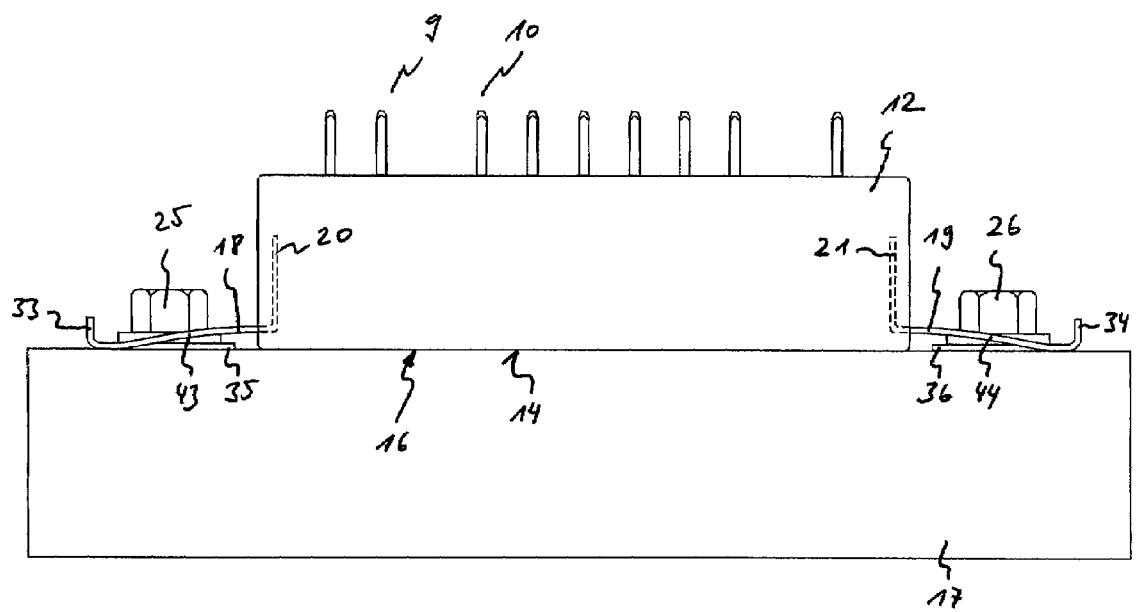
FIG. 6 is a diagram of the module of FIGS. 3 and 4 mounted on a cooling element.

FIG. 6 shows the module of FIGS. 3 and 4 when being mounted on a cooling element 17 by use of fixing screws 25, 26. In the mounted state, the fixing eyes 35, 36 are pressed against the cooling device 17 due to the down forces generated by the fixing screws 25, 26. Thereby, tension will be generated in the webs 61, 62, 63, 64 which press the module resiliently against the cooling device 17.

With the above range of variations and applications in mind, it should be understood that the present invention is not limited by the foregoing description, nor is it limited by the accompanying drawings. Instead, the present invention is limited only by the following claims and their legal equivalents.

What is claimed is:

1. A power semiconductor module, comprising:
    a heat-dissipation contact area configured to thermally connect the power semiconductor module to a cooling element;
    a housing;
    a press-on element comprising an anchoring region captively anchored in the housing;
    a fixing eye resiliently coupled with the anchoring region, the fixing eye having a mounted position different from an un-mounted position; and
    wherein the press-on element is configured to press the power semiconductor module against the cooling element when the fixing eye is pressed against the cooling element in the mounted position.

2. The power semiconductor module as claimed in claim 1, wherein the press-on element comprises a spring arm joining the fixing eye with the anchoring region.

3. The power semiconductor module as claimed in claim 2, wherein the spring arm is partly separated from the fixing eye by a cut.

4. The power semiconductor module as claimed in claim 3, wherein the spring arm is joined with the fixing eye by a web.

5. The power semiconductor module as claimed in claim 4, wherein the press-on element comprises a bent over end arranged adjacent to the web opposite the cut.

6. The power semiconductor module as claimed in claim 5, wherein the bent over end is bent upwardly away from a plane of the heat-dissipation contact area.

7. The power semiconductor module as claimed in claim 1, wherein:
  the housing comprises a mold compound; and
  the anchoring region comprises at least one opening embedded in the mold compound.

8. The power semiconductor module as claimed in claim 1, wherein the press-on element, in an un-mounted state, is spaced distant from a plane of the heat-dissipation contact area.

9. A power semiconductor module, comprising:
  a heat-dissipation contact area configured to thermally connect the power semiconductor module to a cooling element;
  a housing comprising a mold compound;
  a press-on element having an anchoring region captively anchored in the housing;
  at least one opening formed in the anchoring region and embedded in the mold compound;
  a fixing eye resiliently coupled with the anchoring region, the fixing eye having a mounted position different from an un-mounted position; and
  wherein the press-on element is configured to press the power semiconductor module against the cooling element when the fixing eye is pressed against the cooling element in the mounted position.

10. The power semiconductor module as claimed in claim 9, wherein the press-on element comprises a fixing eye resiliently coupled with the anchoring region.

11. The power semiconductor module as claimed in claim 10, wherein the press-on element comprises a spring arm joining the fixing eye with the anchoring region.

12. The power semiconductor module as claimed in claim 11, wherein the spring arm is partly separated from the fixing eye by a cut.

13. The power semiconductor module as claimed in claim 12, wherein the spring arm is joined with the fixing eye by a web.

14. The power semiconductor module as claimed in claim 13, wherein the press-on element comprises a bent over end arranged adjacent to the web opposite the cut.

15. The power semiconductor module as claimed in claim 14, wherein the bent over end is bent upwardly away from a plane of the heat-dissipation contact area.

16. The power semiconductor module as claimed in claim 9, wherein the press-on element, in an un-mounted state, is spaced distant from a plane of the heat-dissipation contact area.

* * * * *